(12) United States Patent
Nakamura

(10) Patent No.: US 7,962,807 B2
(45) Date of Patent: Jun. 14, 2011

(54) SEMICONDUCTOR STORAGE APPARATUS MANAGING SYSTEM, SEMICONDUCTOR STORAGE APPARATUS, HOST APPARATUS, PROGRAM AND METHOD OF MANAGING SEMICONDUCTOR STORAGE APPARATUS

(75) Inventor: Jinichi Nakamura, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 233 days.

(21) Appl. No.: 12/306,872

(22) PCT Filed: Jun. 19, 2007

(86) PCT No.: PCT/JP2007/062319
§ 371 (c)(1),
(2), (4) Date: Dec. 29, 2008

(87) PCT Pub. No.: WO2008/001649
PCT Pub. Date: Jan. 3, 2008

(65) Prior Publication Data
US 2009/0313444 A1    Dec. 17, 2009

(30) Foreign Application Priority Data
Jun. 28, 2006    (JP) .................................. 2006-177852

(51) Int. Cl.
*G11C 29/00* (2006.01)
(52) U.S. Cl. .............. 714/710; 714/47; 714/25; 714/42; 714/718; 714/723; 711/136; 711/160; 365/185.01; 365/185.33; 365/201
(58) Field of Classification Search ........................ None
See application file for complete search history.

(56) References Cited

U.S. PATENT DOCUMENTS

| 6,092,221 | A | * | 7/2000 | Hiratsuka | ........................ 714/47 |
| 6,119,245 | A | | 9/2000 | Hiratsuka | |
| 6,130,837 | A | | 10/2000 | Yamagami et al. | |
| 6,341,085 | B1 | | 1/2002 | Yamagami et al. | |

(Continued)

FOREIGN PATENT DOCUMENTS

JP          5204561 A    8/1993

(Continued)

OTHER PUBLICATIONS

International Search Report for Related International Application No. PCT/JP2007/062319.

*Primary Examiner* — John P Trimmings
(74) *Attorney, Agent, or Firm* — Nutter McClennen & Fish LLP; John J. Penny, Jr.

(57) ABSTRACT

It is an object to provide a semiconductor storage apparatus managing system for implementing a semiconductor storage apparatus which can be actually utilized in place of a hard disk apparatus.
A semiconductor storage apparatus managing system SY for managing an apparatus lifetime of a semiconductor storage apparatus 10 having a semiconductor memory area 15 for storing data and a defective block substituting area 16 for substituting a defective block in the semiconductor memory area 15, includes a storage apparatus side controller 12 for detecting the number of consumed blocks in the defective block substituting area 16 and a host side controller 31 for predicting the apparatus lifetime of the semiconductor storage apparatus 10 based on a result of the detection and giving a notice of a result of the prediction.

11 Claims, 5 Drawing Sheets

U.S. PATENT DOCUMENTS

| | | |
|---|---|---|
| 6,347,051 B2 | 2/2002 | Yamagami et al. |
| 6,425,006 B1 * | 7/2002 | Chari et al. ............... 709/224 |
| 6,473,842 B1 * | 10/2002 | Tsutsumi ................... 711/159 |
| 6,567,334 B2 | 5/2003 | Yamagami et al. |
| 6,646,931 B2 * | 11/2003 | Mizoguchi et al. ......... 365/200 |
| 6,788,609 B2 | 9/2004 | Yamagami et al. |
| 6,925,012 B2 | 8/2005 | Yamagami et al. |
| 7,064,995 B2 | 6/2006 | Yamagami et al. |
| 7,082,510 B2 | 7/2006 | Yamagami et al. |
| 7,120,559 B1 * | 10/2006 | Williams et al. ............. 702/185 |
| 7,184,320 B2 | 2/2007 | Yamagami et al. |
| 7,246,268 B2 * | 7/2007 | Craig et al. .................. 714/42 |
| 7,308,614 B2 * | 12/2007 | Kojori ......................... 714/47 |
| 7,321,990 B2 * | 1/2008 | Zimmer et al. ............... 714/42 |
| 7,512,847 B2 * | 3/2009 | Bychkov et al. ............ 714/723 |
| 7,590,001 B2 * | 9/2009 | Janai ....................... 365/185.09 |
| 7,778,077 B2 * | 8/2010 | Gorobets et al. ......... 365/185.09 |
| 2002/0091965 A1 * | 7/2002 | Moshayedi ..................... 714/8 |
| 2003/0037287 A1 * | 2/2003 | Nakamura et al. ............ 714/30 |
| 2005/0188278 A1 * | 8/2005 | Zimmer et al. ................ 714/42 |
| 2007/0055914 A1 * | 3/2007 | Chandwani et al. .......... 714/47 |
| 2007/0076507 A1 | 4/2007 | Yamagami et al. |
| 2007/0180328 A1 * | 8/2007 | Cornwell et al. ............. 714/42 |
| 2008/0106939 A1 | 5/2008 | Yamagami et al. |
| 2009/0024871 A1 * | 1/2009 | Emaru et al. ................... 714/6 |

FOREIGN PATENT DOCUMENTS

| | | | |
|---|---|---|---|
| JP | 2001154922 A | | 6/2001 |
| JP | 2003-085054 | * | 3/2003 |
| JP | 200385054 A | | 3/2003 |
| JP | 2003140979 A | | 5/2003 |
| JP | 2006023815 A | | 1/2006 |
| KR | 1999-23238 B1 | | 3/1999 |

* cited by examiner

NUMBER OF CONSUMED BLOCK IN DEFECTIVE BLOCK SUBSTITUTING AREA
= B+C $$\begin{bmatrix} \text{B: NUMBER OF CONGENITAL DEFECTIVE BLOCK IN FACTORY SHIPMENT} \\ \text{C: NUMBER OF ACQUIRED DEFECTIVE BLOCK BECOMING DEFECTIVE} \\ \text{IN OPERATION} \end{bmatrix}$$

CONSUMPTION RATE OF DEFECTIVE BLOCK SUBSTITUTING AREA = (B+C)/A*100

$$\begin{bmatrix} \text{A: TOTAL NUMBER OF DEFECTIVE BLOCK IN DEFECTIVE BLOCK} \\ \text{SUBSTITUTING AREA} \end{bmatrix}$$

SURVIVAL RATE OF DETECTIVE BLOCK SUBSTITUTING AREA = (A-B-C)/A*100

(b)

APPARATUS LIFETIME (RESIDUAL TIME) = (A-B-C)/E

E: NUMBER OF GENERATION OF ACQUIRED DEFECTIVE BLOCK PER HOUR

E = D*CONSTANT FOR CONVERTING UNIT TIME FOR RECORDING NUMBER OF GENERATION OF ACQUIRED DEFECTIVE BLOCK INTO ONE HOUR ($\alpha$)

$$\begin{bmatrix} \text{D1: WORST VALUE OF NUMBER OF GENERATION OF ACQUIRED} \\ \text{DEFECTIVE BLOCK IN UNIT TIME} \\ \text{D2: MEAN VALUE OF NUMBER OF GENERATION OF ACQUIRED} \\ \text{DEFECTIVE BLOCK IN UNIT TIME} \\ \text{D3: CURRENT VALUE OF NUMBER OF GENERATION OF ACQUIRED} \\ \text{DEFECTIVE BLOCK IN UNIT TIME} \end{bmatrix}$$

(c)

NUMBER OF GENERATION OF ACQUIRED DEFECTIVE BLOCK IN UNIT TIME = D

D = LAST C − CURRENT C

SEMICONDUCTOR STORAGE APPARATUS MANAGING SYSTEM, SEMICONDUCTOR STORAGE APPARATUS, HOST APPARATUS, PROGRAM AND METHOD OF MANAGING SEMICONDUCTOR STORAGE APPARATUS

TECHNICAL FIELD

The prevent invention relates to a semiconductor storage apparatus managing system for managing a semiconductor storage apparatus having an apparatus lifetime, a semiconductor storage apparatus, a host apparatus, a program, and a method of managing a semiconductor storage apparatus.

BACKGROUND ART

In recent years, attention has been paid to a semiconductor storage apparatus (a silicon disk) using, as a storage medium, a nonvolatile memory that is typical of an NAND type flash memory as a substitution for a hard disk apparatus. The reason is as follows. In contrast from a hard disk apparatus, a semiconductor storage apparatus does not provide an element causing a failure such as a rotating mechanism, reduces consumed power, provides continuous use for 24 hours, does not make an operation sound, and provides a shock resistance to vibration. In the semiconductor storage apparatus of this type, however, the number of times for rewriting data is limited to approximately several ten thousands to several hundred thousands times as an typical apparatus lifetime. In addition, if the rewrite concentrates in a specific area (a storage element), the lifetime is further shortened. The technique for eliminating the problems that have been described in Patent Document 1 is well-known.

Patent Document 1: Japanese Patent Publication 05-204561 A

The Patent Document 1 has described a semiconductor storage apparatus (a semiconductor disk) including, in a flash memory, a data memory area for storing data, a substituting memory area for substituting an error region in the data memory area, and an error memory area having, as error information, an address of a substituting memory of a data memory in which an error is generated, and having a memory controller for carrying out read/write from/to each of the areas. With the structure, the memory controller reads the error information in the error memory area and carries out the read/write from/to the data memory area when the data memory area is normal and the substituting memory area when the data memory area is abnormal. In the writing operation, if the error is generated, an empty region in a defective block substituting area is searched and data are written to the empty region, and error information about the memory area having an error is updated. The control is carried out to save the error caused by the rewrite of the flash memory, thereby prolonging a lifetime of the semiconductor storage apparatus.

DISCLOSURE OF THE INVENTION

Problems to be Solved by the Invention

Although the technique described in the Patent Document 1 can prolong the lifetime of the semiconductor storage apparatus, the lifetime cannot be prolonged. In addition, there have been proposed various techniques for avoiding the apparatus lifetime (a smoothing processing (wear leveling) for avoiding a concentration of rewrite in a specific area), and none of them can prolong the lifetime infinitely.

In the related art, accordingly, it is impractical to use the semiconductor storage apparatus as a substitution for a hard disk apparatus. As a matter of course, it is possible to utilize the semiconductor storage apparatus as a storage apparatus, for example, an incorporated apparatus that prohibits or limits the number of rewriting operations or an audio apparatus capable of guessing the number of rewriting operations to some degree. However, its application or operation is restricted. Moreover, it is also possible to propose a method of pre-calculating a lifetime and limit use to the pre-calculated lifetime or periodically carrying out an exchange. In the former case, a reliability is poor. In the latter case, the exchange is required before the apparatus lifetime. Thus, none of them is practical.

In consideration of the problems, it is an object to provide a semiconductor storage apparatus managing system, a semiconductor storage apparatus, a host apparatus, a program and a method of managing a semiconductor storage apparatus which serve to implement a semiconductor storage apparatus capable of being utilized as a substitution for a hard disk apparatus.

MEANS FOR SOLVING THE PROBLEM

The invention provides a semiconductor storage apparatus managing system for managing an apparatus lifetime of a semiconductor storage apparatus having a semiconductor memory area for storing data and a defective block substituting area for substituting a defective block in the semiconductor memory area, including consumed block number detecting means for detecting the number of consumed blocks in the defective block substituting area, and lifetime notifying means for predicting the apparatus lifetime of the semiconductor storage apparatus based on a result of the detection of the consumed block number detecting means and giving a notice of a result of the prediction.

Moreover, the invention provides a method of managing a semiconductor storage apparatus having a semiconductor memory area for storing data and a defective block substituting area for substituting a defective block in the semiconductor memory area, the method comprising: predicting an apparatus lifetime of the semiconductor storage apparatus based on a consumption history of the defective block substituting area; and giving a notice of a result of the predicting.

According to the structures, the apparatus lifetime of the semiconductor storage apparatus is predicted based on the number of consumed blocks (consumption history) in the defective block substituting area for substituting the defective block in the semiconductor memory area and the notice of the result of the prediction is given. Therefore, a user can grasp the apparatus lifetime of the semiconductor storage apparatus. Consequently, it is possible to grasp the semiconductor storage apparatus as an article of consumption, thereby exchanging the semiconductor storage apparatus at a proper time. Therefore, it is possible to prevent the semiconductor storage apparatus from reaching the apparatus lifetime against a user's will, resulting in a loss or damage of a reliability of data.

Moreover, the apparatus lifetime is predicted based on the number of consumed blocks (consumption history) in the defective block substituting area. As compared with the case in which the number of rewriting operations is counted to predict the apparatus lifetime, therefore, it is possible to predict the lifetime more accurately. Furthermore, it is not necessary to count the number of rewriting operations. Therefore, it is possible to eliminate a circuit structure such as a counter or a memory for storing a count number.

It is preferable that the semiconductor storage apparatus managing system should further include step notifying means for stepwise giving a notice of a consumption rate or a survival rate of the defective block substituting area which is obtained from the result of the detection of the consumed block number detecting means.

According to the structure, the user can grasp the consumption rate or the survival rate of the defective block substituting area stepwise. More specifically, it is possible to confirm circumstances in which the semiconductor storage apparatus reaches the apparatus lifetime. Therefore, the user can utilize the semiconductor storage apparatus without anxiety.

It is preferable that the semiconductor storage apparatus managing system should further include smoothing means for smoothing the number of rewriting operations to each block in the semiconductor memory area.

According to the structure, it is possible to prolong the apparatus lifetime through the smoothing processing.

In the semiconductor storage apparatus managing system, it is preferable that the semiconductor memory area and the defective block substituting area should be constituted by a nonvolatile memory.

According to the structure, the nonvolatile memory is used. Also after a power supply is turned off, therefore, data can be held. In other words, it is not necessary to employ a complicated processing required for the case in which the nonvolatile memory is used (a processing for once writing data in the semiconductor memory area and the defective block substituting area to another nonvolatile memory before turning off the power supply) or a backup battery.

In the semiconductor storage apparatus managing system, it is preferable that at least one of the lifetime notifying means and the step notifying means should give a notice by using any of means including a screen display, a voice output, an electronic mail transmission, a command transmission and a telephone.

According to the structure, it is possible to give a user a notice of an apparatus lifetime and the number of consumed blocks in the defective block substituting area by using means such as a screen display, a voice output, an electronic mail transmission, a command transmission or a telephone.

In the semiconductor storage apparatus managing system, it is preferable that the lifetime notifying means should predict the apparatus lifetime based on any of the worst value, a mean value and a current value of the number of generation of acquired defective blocks in a unit time of the defective block substituting area.

According to the structure, the apparatus lifetime is predicted based on the number of generation of acquired defective blocks in a unit time of the defective block substituting area (a value obtained by subtracting the number of congenital defective blocks in a factory shipment from the number of consumed blocks (the total number of defective blocks) in the defective block substituting area). Therefore, it is possible to carry out a more accurate prediction in which the influence of the number of congenital defective blocks is eliminated. By using the worst value to carry out the prediction, moreover, it is possible to reliably give a notice of the apparatus lifetime before reaching the apparatus lifetime. By using the mean value to carry out the prediction, furthermore, it is possible to give the notice of the apparatus lifetime also in the case in which the number of generation of acquired defective blocks is not increased uniformly. By using the current value to carry out the prediction, moreover, it is not necessary to store the number of acquired defective blocks which are obtained in the past. In the case in which it is assumed that the number of generation of acquired defective blocks is increased uniformly, it is possible to give a notice which is suitable for a practical use environment.

In the semiconductor storage apparatus managing system, it is preferable that the semiconductor storage apparatus managing system should include the semiconductor storage apparatus, and a host apparatus for giving access to the semiconductor storage apparatus, the semiconductor storage apparatus should have a storage apparatus side controller for implementing the consumed block number detecting means and the smoothing means, and the host apparatus should have a host side controller for implementing the lifetime notifying means and the step notifying means.

According to the structure, the host side controller implements the lifetime notifying means and the step notifying means. Therefore, it is sufficient that the storage apparatus side controller implements the consumed block number detecting means and the smoothing means. More specifically, it is possible to reduce a control load and to obtain an inexpensiveness in the semiconductor storage apparatus.

In the semiconductor storage apparatus managing system, it is preferable that the host side controller should poll the storage apparatus side controller to acquire a result of detection of the consumed block number detecting means.

According to the structure, the host side controller polls the semiconductor apparatus side controller so that the result of the detection of the consumed block number detecting means (the number of consumed blocks in the defective block substituting area) can be obtained. Therefore, it is sufficient that the storage apparatus side controller simply responds thereto. Consequently, it is possible to reduce a control load of the storage apparatus side controller (the semiconductor storage apparatus side).

A semiconductor storage apparatus according to the invention is characterized in that it is applied to the semiconductor storage apparatus managing system.

A host apparatus according to the invention is characterized in that it is applied to the semiconductor storage apparatus managing system.

A program according to the invention serves to cause a computer to function as each means in the semiconductor storage apparatus managing system.

By using them, it is possible to provide a semiconductor storage apparatus managing system for implementing a semiconductor storage apparatus which can be actually utilized as a substitution for a hard disk apparatus.

BRIEF DESCRIPTION OF THE DRAWINGS

FIG. 3 is a diagram for explaining a process for calculating a consumption rate, a survival rate and an apparatus lifetime in a semiconductor storage apparatus.

BEST MODE FOR CARRYING OUT THE INVENTION

Figure 1:
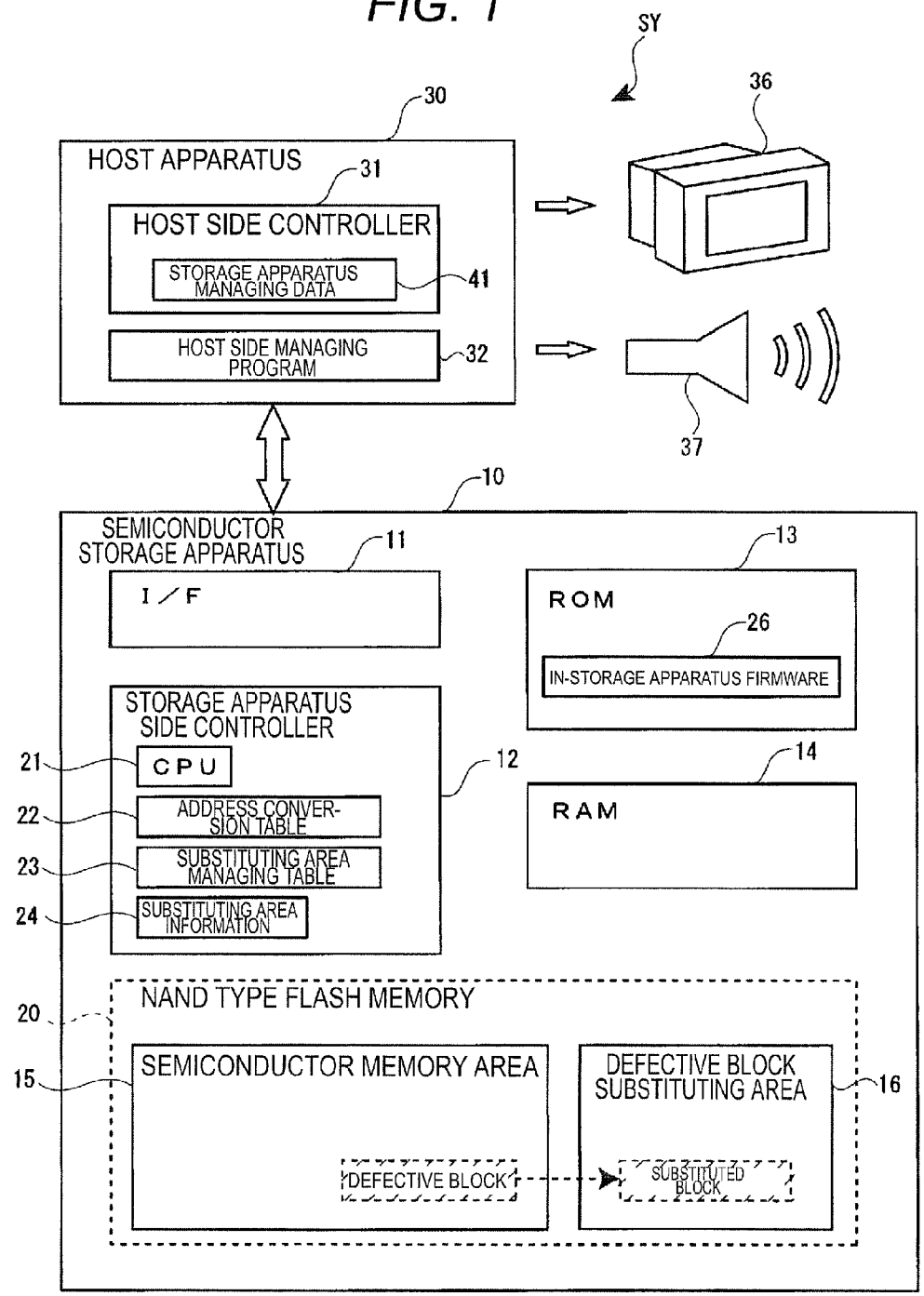
FIG. 1 is a block diagram showing a system structure of a semiconductor storage apparatus managing system according to an embodiment of the invention.

Description will be given to a semiconductor storage apparatus managing system, a semiconductor storage apparatus, a host apparatus, a program and a method of managing a semiconductor storage apparatus according to an embodiment of the invention. FIG. 1 is a block diagram showing a system structure of a semiconductor storage apparatus managing system SY. The semiconductor storage apparatus managing system SY includes a semiconductor storage apparatus (for example, a silicon disk) 10 to be utilized as a substitution for a hard disk apparatus, a host apparatus (for example, a personal computer) 30 for giving access to the semiconductor storage apparatus 10, a display 36 to be a peripheral apparatus of the host apparatus 30, and a speaker 37.

The semiconductor storage apparatus 10 includes an I/F block 11, a storage apparatus side controller 12, an ROM 13, an RAM 14 and a NAND type flash memory 20, and they are connected through an internal bus that is not shown. Moreover, the NAND type flash memory 20 has a semiconductor memory area 15 for storing data as a storage medium and a defective block substituting area 16 for substituting a defective block in the semiconductor memory area 15.

Since the NAND type flash memory 20 is advantageous in respect of bit unit cost and capacity, it is often used as a storage device.

A flash memory having one bit per cell that is usually referred to as an SLC (single level cell) is used for the NAND type flash memory 20. In the embodiment, it is also possible to use a flash memory having and increased number of bits per cell that is referred to as an MLC (multilevel cell) having a limited number of rewriting operations and a poor reliability because its lifetime can be managed. By using the MLC, thus, it is possible to increase capacity and to enhance a bit unit cost.

Moreover, it is also possible to constitute the semiconductor memory area 15 and the defective block substituting area 16 by an AND type flash memory or an SRAM having a backup battery in addition to the NAND type flash memory 20.

The I/F block 11 serves to carry out a data transfer to the host apparatus 30 and has a memory (a buffer that is not shown) for buffering read/write data and a command from the host apparatus 30 in order to increase a data transfer speed. The I/F block 11 can employ a data transfer standard such as IDE, SCSI or serial ATA.

The storage apparatus side controller 12 has a CPU 21, and furthermore, an address conversion table 22 to be read/written by the CPU 21, a substituting area managing table 23 and substituting area information 24.

The address conversion table 22 is a correspondence list to be referred to when the CPU 21 relates a logic block address for carrying out a transfer together with the host apparatus 30 to a physical block address for writing data into the semiconductor storage apparatus 10.

As described above, the semiconductor storage apparatus 10 according to an embodiment employs the NAND type flash memory 20. However, the NAND type flash memory 20 cannot overwrite data. In the case in which data are rewritten, therefore, there is carried out a process for writing new data to an erased block and erasing the block to which non-rewritten data are written. The CPU 21 rewrites data of a corresponding block in accordance with contents of the address conversion table 22 during every data rewrite (the address conversion table defines a corresponding relationship between the logic block address from the host apparatus 30 and the physical block address of the semiconductor storage apparatus 10). In that case, the CPU 21 counts the number of rewriting or erasing operations every block (physical block address) and data are written into a block having a small number of rewriting operations when they are equal to or greater than a certain set number. More specifically, there is carried out a smoothing process for moving the data of a block to another block to rewrite the corresponding address conversion table 22 in such a manner that the number of rewriting operations to each block in the semiconductor memory area 15 is smoothed (smoothing means).

In some cases, moreover, a writing error is generated in the semiconductor memory area 15 with an increase in the number of rewriting operations. In the case in which the writing error is generated, the CPU 21 executes a process for assigning an address of a defective block in the corresponding semiconductor memory area 15 to a substituting block in the defective block substituting area 16 and subsequently giving access to the defective block substituting area 16. Thus, an address of a defective block (hereinafter referred to as an "acquired defective block") in which the writing error is generated in an operation (a normal use) is written to the substituting area managing table 23 and subsequent access is prohibited. In other cases, the defective block may have been present in the NAND type flash memory 20 in a factory shipment. In these cases, an address of the congenital defective block is also written to the substituting area managing table 23.

The substituting area information 24 is data for managing the apparatus lifetime of the semiconductor storage apparatus 10. Specifically, the substituting area information 24 is data related to a total number (A) of defective blocks in the defective block substituting area 16, a number (B) of congenital defective blocks in the factory shipment, a number (C) of acquired defective blocks that became defective in operation, and a number (D) of generation of the acquired defective blocks in a unit time (see FIG. 3).

The total number (A) of defective blocks represents a total number of blocks in the defective block substituting area 16 that are prepared for substituting the defective block in the semiconductor memory area 15. The number (B) of congenital defective blocks represents a value that is detected and registered in the factory shipment according to a detection specification of the manufacturer. The number (C) of acquired defective blocks represents a value obtained by adding and rewriting the number of blocks that is acquired by the CPU 21 every time the defective block substituting area 16 is acquired. Furthermore, the number (D) of generation of acquired defective blocks in a unit time is obtained by counting the number of generation of acquired defective blocks every ten minutes and carrying out a calculation based on a difference from a last count value. A detailed method of calculating the apparatus lifetime will be described below.

In addition, the CPU 21 carries out a process for analyzing a command for a hard disk and assigning the command to the NAND type flash memory 20 because the semiconductor storage apparatus 10 according to the embodiment is used as a substitution for a hard disk.

It is preferable that all of the address conversion table 22, the substituting area managing table 23 and the substituting area information 24 be stored in a nonvolatile method and the storage apparatus side controller 12 does not need to have them. In other words, a general purpose memory chip (EEPROM) for storing them may be provided.

On the other hand, the ROM 13 has an in-storage apparatus firmware 26. The in-storage apparatus firmware 26 records a control program for implementing each process by the storage apparatus side controller 12 (CPU 21), and furthermore, a control program for carrying out a normal process (read/write from/to the host apparatus 30, a reply of a status to a command transmission from the host apparatus 30 or an initialization in power-ON (a save processing in power-OFF)).

Moreover, the RAM 14 is used as a work area in the processes of the CPU 21 and stores various flags. For example, in the case in which the acquired defective blocks are rapidly increased in a unit time or the case in which an abnormality is generated in the semiconductor storage apparatus 10, the CPU 21 causes a flag indicative of their error information to be stored on the RAM 14 and gives a notice to the host apparatus 30. Upon receipt of the notice of the error information, the host apparatus 30 prohibits the write to the semiconductor storage apparatus 10 and gives a notice of the purport.

Assuming that the congenital defective block and the acquired defective block are generated, the semiconductor memory area 15 forms a writing algorithm thereof. For error detection, moreover, an ECC having a correcting function is used in place of a parity.

The defective block substituting area 16 substitutes the defective block in the semiconductor memory area 15. When almost all of the areas are consumed, it is decided by the host apparatus 30 that the apparatus lifetime is reached. In other words, the defective block substituting area 16 is also used as an index for deciding the apparatus lifetime.

Subsequently, description will be given to a structure on the host apparatus 30 side. The host apparatus 30 includes a host side controller 31 and a host side managing program 32. The host side controller 31 periodically polls the storage apparatus side controller 12 based on the host side managing program 32 and acquires the substituting area information 24 and various error information through a response of the storage apparatus side controller 12 thereto. Based on the information thus acquired, moreover, the apparatus lifetime of the semiconductor storage apparatus 10 is predicted (calculated) and a notice of a result of the prediction is given (lifetime notifying means). Based on the information thus acquired, a consumption rate or a survival rate of the defective block substituting area 16 is calculated and a notice of the consumption rate or the survival rate is given stepwise (step notifying means).

A notice of the consumption rate or the survival rate is given stepwise indicates that a predetermined notice is not given when the consumption rate or the survival rate exceeds a predetermined value but a notice is periodically given in such a manner that a user can decide circumstances in which the value is varied irrespective of the values (for example, a bar display or a circle display of a percentage). Moreover, a notice of the apparatus lifetime, or the consumption rate or the survival rate of the defective block substituting area 16 is given indicates that their values are displayed on the display 36 or a voice is output (a voice guidance or the generation of a predetermined electronic sound) through the speaker 37. In the case in which the host apparatus 30 has an internet connecting function, moreover, a notice may be given to a personal computer or various information terminals to be a transmission target through a transmission of an electronic mail or may be given to a server which is connected through a network by a command transmission (remote monitoring from a server may be carried out). In the case in which the host apparatus 30 has a telephone connecting function, furthermore, a notice may be given to a partner to be a talking target through a telephone.

Moreover, the host side controller 31 records, as storage apparatus managing data 41, the substituting area information 24 acquired from the semiconductor storage apparatus 10 and updates the same data every polling. For example, in the case in which the user makes an inquiry about the apparatus lifetime of the semiconductor storage apparatus 10 or the consumption rate or the survival rate of the defective block substituting area 16 by using operating means which is not shown (a keyboard or a mouse), the values are given through a screen display or a voice output based on the storage apparatus managing data 41.

The host side managing program 32 stores a control program for the host side controller 31 to carry out the various processes or a normal process together with the semiconductor storage apparatus 10. Moreover, the host side managing program 32 also includes a managing tool for giving the notice of the apparatus lifetime of the semiconductor storage apparatus 10 or the consumption rate or survival rate of the defective block substituting area 16 and carrying out various setting related thereto.

Figure 2:
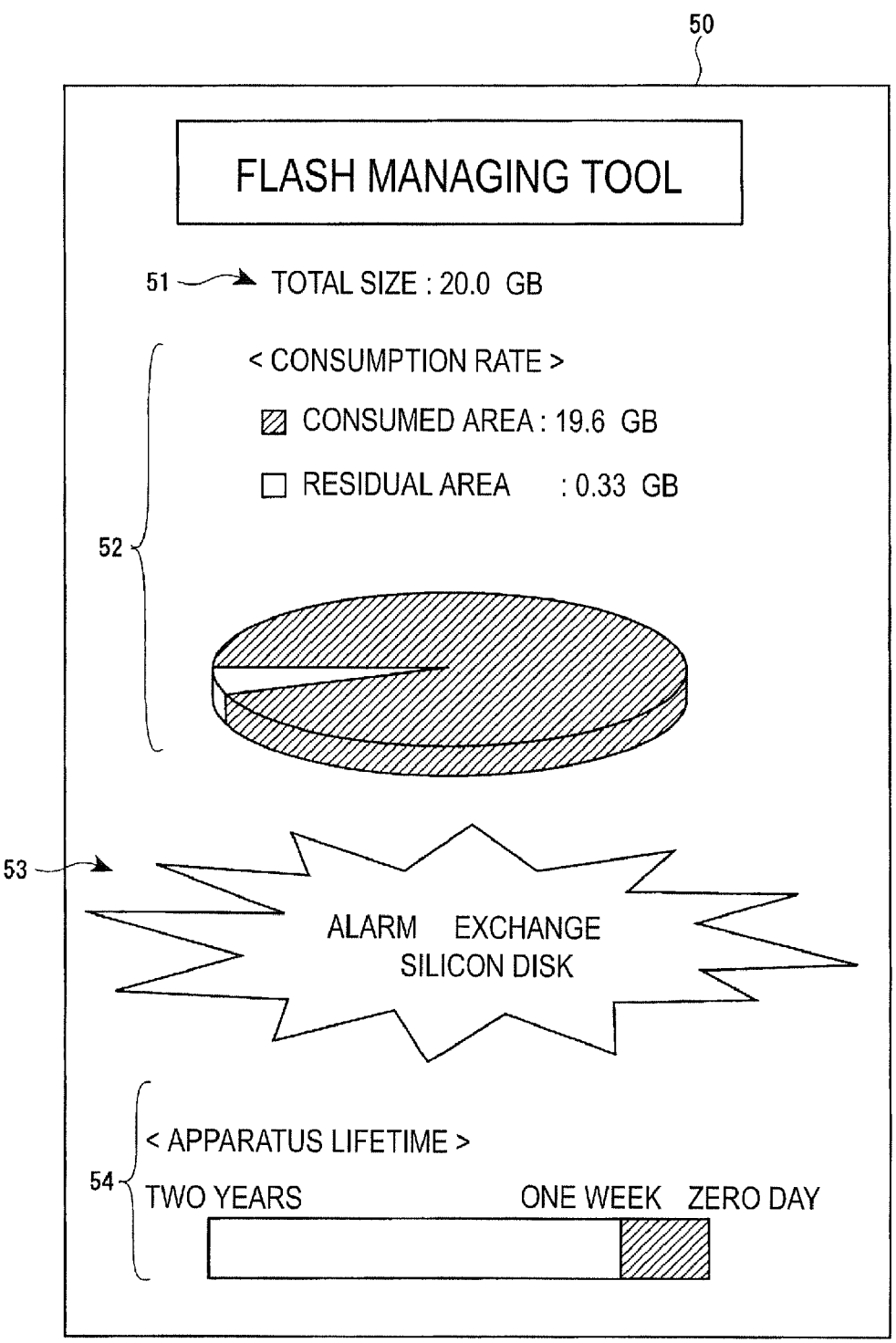
FIG. 2 is a diagram showing a display example through a managing tool.

FIG. 2 shows a notice example (a display example) 50 through the managing tool. There are displayed a total size 51 of the defective block substituting area 16, a circle display (a consumption rate and a survival rate) 52 indicative of the consumed and residual areas of the defective block substituting area 16 and their rates, an alarm display 53 for promoting an exchange of the semiconductor storage apparatus 10 (silicon disk), and a calculation result 54 of the apparatus lifetime.

The alarm display 53 is displayed if it is decided that the consumption rate of the defective block substituting area 16 is 60% to 90%. If the consumption rate of the defective block substituting area 16 exceeds 90%, there is given, in place of the alarm display 53, a danger display indicative of the purport that the write to the semiconductor storage apparatus 10 is to be prohibited. It is possible to set, through the managing tool, whether or not the write is to be prohibited when the consumption rate of the defective block substituting area 16 exceeds 90%.

In the display example of FIG. 2, moreover, two years to zero day is displayed for the apparatus lifetime 54. It is also possible to set, through the managing tool, a unit of the apparatus lifetime 54 to be displayed, for example, a time unit or a unit of the number of days. Moreover, it is also possible to set a reference for displaying the apparatus lifetime 54, for example, to start the display of the apparatus lifetime 54 at one month or less.

Furthermore, the display 50 through the managing tool shown in FIG. 2 may be resident in an OS (not shown) at the start of the host apparatus 30 and may be stored in a task bar or may be displayed by starting the host side managing program 32 (the managing tool). In addition, the managing tool may include a function for setting a threshold to carry out the alarm display or the danger display or a function for selecting notifying means (a service call to a managing company of the semiconductor storage apparatus managing system SY, an electronic mail set to a manager, a remote communication or a telephone). In addition, it is also possible to include an exchanging guide function of the semiconductor storage apparatus 10 (a screen display through an animation or a voice output) or a copying function for exchanging the semiconductor storage apparatus 10 (save/recovery via a memory).

With reference to FIG. 3, next, description will be given to a process for calculating the consumption rate, the survival rate and the apparatus lifetime of the semiconductor storage apparatus 10 through the host side controller 31. Calculating algorithms shown in the following (a) and (b) are included in the host side managing program 32. Moreover, a calculating algorithm shown in the following (c) is included in the in-storage apparatus firmware 26.

Furthermore, the values of the total number (A) of defective blocks in the defective block substituting area 16, the number (B) of congenital defective blocks in a factory shipment, the number (C) of acquired defective blocks that became defective in an operation and the number (D) of generation of acquired defective blocks in a unit time are data included in the substituting area information 24 which are acquired from the semiconductor storage apparatus 10 by the host side controller 31.

As shown in FIG. 3(*a*), the number of consumed blocks in the defective block substituting area 16 is calculated through the number (B) of congenital defective blocks+the number (C) of acquired defective blocks. Moreover, the consumption rate of the defective block substituting area 16 is obtained through a division of the number of consumed blocks in the defective block substituting area 16 by the total number (A) of defective blocks in the defective block substituting area 16, that is, is calculated in accordance with an expression of (B+C)/A*100. In addition, the survival rate of the defective block substituting area 16 is calculated in accordance with an expression of (A−B−C)/A*100.

As shown in FIG. 3(*b*), moreover, the apparatus lifetime, that is, a residual time till a use disable state of the semiconductor storage apparatus 10 is calculated in accordance with an expression of (A−B−C)/E, wherein E represents the number of generation of acquired defective blocks per hour. The number (E) of generation of acquired defective blocks per hour is calculated in accordance with the number (D) of generation of acquired defective blocks per unit time*a constant (α) for converting, into one hour, a unit time for recording the number of generation of acquired defective blocks. For example, assuming that the unit time for recording the number of generation of acquired defective blocks is set to be ten minutes, α=one hour/ten minutes=6 is obtained so that E=6*D is calculated.

Moreover, any of the worst value (D1), a mean value (D2) and a current value (the total newest value, D3) can be employed for the number (D) of generation of acquired defective blocks in a unit time. In one embodiment, the NAND type flash memory 20 is used as a storage medium of the semiconductor storage apparatus 10 and it is possible to predict that the acquired defective block can be uniformly increased by the influence of the memory characteristic and the smoothing process. Accordingly, the current value (D3) which is suitable for an actual use environment is employed.

In the case in which the apparatus lifetime is calculated by using the worst value (D1), it is possible to reliably give a notice of the apparatus lifetime before the apparatus lifetime is reached. In the case in which the apparatus lifetime is calculated by using the mean value (D2), moreover, it is possible to give a notice of an approximate apparatus lifetime also in the case in which the number of generation of acquired defective blocks is not increased uniformly. Accordingly, it is preferable that whether any of the values D1 to D3 is employed or any combination of the values D1 to D3 is employed should be determined depending on the memory characteristic or the use. Moreover, the managing tool may include a selecting function.

As shown in FIG. 3(*c*), moreover, the number (D) of generation of acquired defective blocks in a unit time is calculated in accordance with D=a last number (C) of acquired defective blocks−a current number (C) of acquired defective blocks. The calculation processing shown in FIG. 3(*c*) is executed by the storage apparatus side controller 12, and a value of D to be a result of the calculation is provided as the substituting area information 24 to the host apparatus 30.

Figure 4:
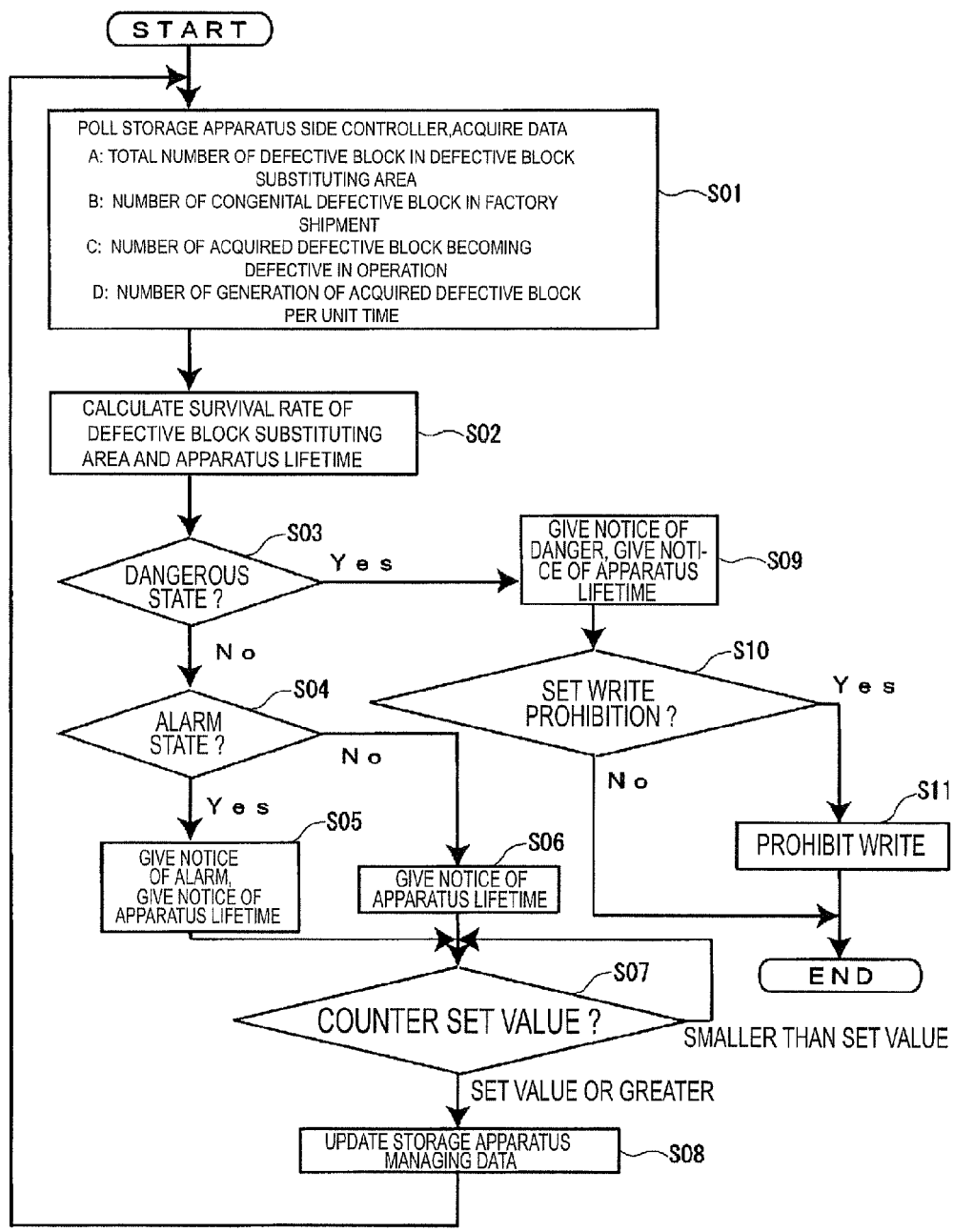
FIG. 4 is a flowchart showing a process for managing the semiconductor storage apparatus.

Referring to FIG. 4, next, description will be given to a management process flow of the semiconductor storage apparatus 10 through the host side controller 31. The host side controller 31 polls the storage apparatus side controller 12 to acquire the substituting area information 24 (the data of A to D) based on a polling interval set by the managing tool (a counter set value) when a power supply for the host apparatus 30 is turned on (S01).

Subsequently, the survival rate of the defective block substituting area 16 and the apparatus lifetime are calculated based on the substituting area information 24 thus acquired and the equations shown in FIGS. 3(*a*) and 3(*b*) (S02). Then, it is decided whether the survival rate of the defective block substituting area 16 is lower than 10% or not (whether a dangerous state is brought or not) (S03). If the survival rate is not lower than 10% (S03: No), it is decided that the dangerous state has not been brought yet.

If it is decided that the dangerous state is not brought, furthermore, it is decided whether the survival rate of the defective block substituting area 16 is lower than 40% or not (an alarm state is brought or not) (S04). If the survival rate is lower than 40% (S04: Yes), it is decided that the alarm state is brought and a notice of the apparatus lifetime (the consumed and residual regions in the defective block substituting area 16 and their rates 52, and the apparatus lifetime 54) is given together with the alarm notice 53 (S05, see FIG. 2). If the survival rate of the defective block substituting area 16 is equal to or higher than 40% (S04: No), moreover, it is decided that the alarm state has not been brought yet and a notice of the apparatus lifetime other than the alarm notice is given (S06).

After the notice is given, reference is made to a counter set value (S07). If a value of the counter is smaller than the set value, a polling waiting state is brought. If the value of the counter is equal to or greater than the set value, moreover, the storage apparatus managing data 41 are updated (S08) and the storage apparatus side controller 12 is polled again (S01).

On the other hand, if it is decided that the dangerous state is brought (if the survival rate of the defective block substituting area 16 is lower than 10%) at S03 (S03: Yes), a notice of the apparatus lifetime is given together with a notice of a danger (S09). As the notice of a danger (in the display 50 through the managing tool, for example), there is given a notice that the write to the semiconductor storage apparatus 10 is prohibited or a guarantee is impossible. If setting is carried out to prohibit the write in the dangerous state through the managing tool (S10: Yes), moreover, a process for prohibiting the write is executed (S11) and the process for managing the semiconductor storage apparatus 10 is then ended.

As described above, according to an embodiment, the apparatus lifetime of the semiconductor storage apparatus 10 is predicted and the notice of the result of the prediction is given based on the number of consumed blocks (consumption history) in the defective block substituting area 16. Therefore, the user can grasp the apparatus lifetime of the semiconductor storage apparatus 10. Consequently, it is possible to prevent the semiconductor storage apparatus 10 from reaching the apparatus lifetime against the user's will, resulting in a loss or damage of the reliability of data. Moreover, the apparatus lifetime is predicted based on the number of consumed blocks (consumption history). As compared with the case in which the number of rewriting operations is counted to predict the apparatus lifetime, consequently, it is possible to predict the lifetime more accurately. Furthermore, it is not necessary to count the number of rewriting operations. Therefore, it is possible to eliminate a circuit structure such as a counter and a memory for storing a count number, thereby simplifying the structure of the apparatus.

In addition, the notice of the consumption rate or survival rate of the defective block substituting area 16 is given stepwise. Therefore, the user can confirm the circumstances in which the semiconductor storage apparatus 10 reaches the apparatus lifetime and can utilize the semiconductor storage apparatus 10 without anxiety.

Moreover, the apparatus lifetime is calculated based on the number of generation of acquired defective blocks in the unit time of the defective block substituting area 16. Therefore, it is possible to predict the apparatus lifetime more accurately. Furthermore, the apparatus lifetime is predicted by using the current value (D3) of the number of generation of acquired defective blocks in the unit time. For this reason, it is not necessary to store the number of generation of acquired defective blocks obtained in the past. In the case in which it is assumed that the number of generation of acquired defective blocks is uniformly increased as in the NAND type flash memory 20, it is possible to give a notice which is suitable for an actual use environment.

If an MLC (multilevel cell) is employed for the NAND type flash memory 20, moreover, it is possible to write a multiple value to one cell, and to increase a capacity and to enhance a cost merit. As compared with an SLC (single level cell), furthermore, the MLC has a smaller margin related to a read/write voltage and a temperature. Therefore, there is a drawback that an error rate is high and an apparatus lifetime (a durability) is poor (Based on a current standard of technology, the SLC has a rewriting number guaranteed value of a hundred thousand, while the MLC has a rewriting number guaranteed value of ten thousand or less). According to an embodiment, the apparatus lifetime can be predicted. Therefore, it is possible to make up for the drawback.

Moreover, the notice of the consumption rate of the defective block substituting area 16 or the apparatus lifetime of the semiconductor storage apparatus 10 is given at the host apparatus 30 side. Therefore, it is sufficient to detect the number of consumed blocks at the semiconductor storage apparatus 10 side, thereby relieving a control load and reducing a cost.

Figure 5:
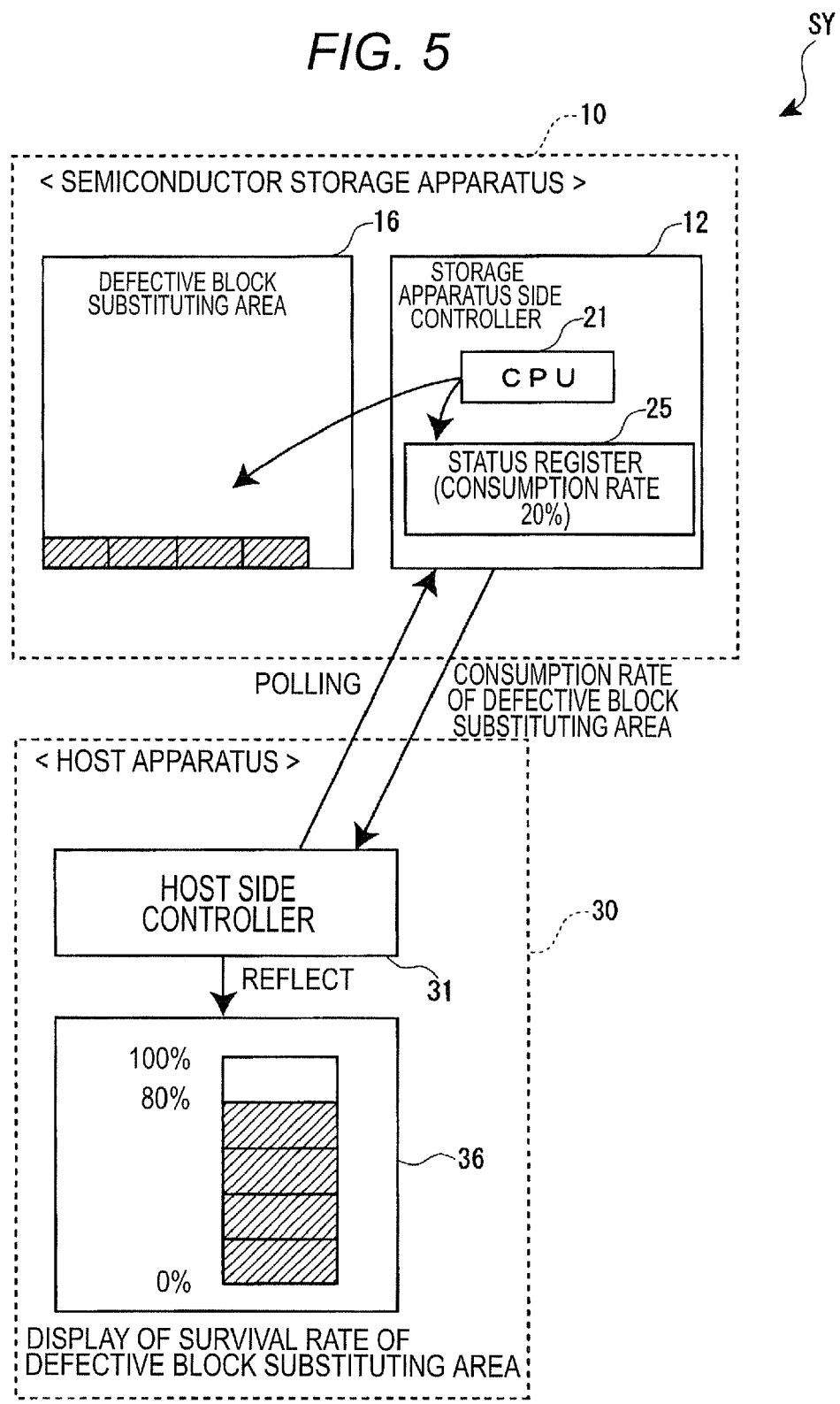
FIG. 5 is a diagram for explaining the case in which a consumption rate of a defective block substituting area is calculated at the semiconductor storage apparatus side.

While it is assumed that the consumption rate of the defective block substituting area 16 is calculated on the host apparatus 30 side in an embodiment, it may be carried out on the semiconductor storage apparatus 10 side. In this case, as shown in FIG. 5, the CPU 21 in the storage apparatus side controller 12 refers to the defective block substituting area 16 to detect the total number of defective blocks, thereby calculating the consumption rate of the defective block substituting area 16. Moreover, information about the consumption rate thus calculated (20% in the example shown in the drawing) is written to a status register 25 in the storage apparatus side controller 12. On the other hand, the host side controller 31 periodically polls the storage apparatus side controller 12 to acquire data on the consumption rate of the defective block substituting area 16, and the survival rate of the defective block substituting area 16 is obtained from the value and is reflected (displayed) on the display 36.

Thus, it is possible to have the function for calculating the consumption rate of the defective block substituting area 16 at the semiconductor storage apparatus 10 side. Moreover, it is also possible to calculate the survival rate and the apparatus lifetime at the semiconductor storage apparatus 10 side in addition to the consumption rate. Furthermore, it is also possible to have the function for giving a notice at the semiconductor storage apparatus 10 side based on the result of the calculation. By employing a structure in which the apparatus lifetime is calculated and the notice is given at the semiconductor storage apparatus 10 side, thus, it is possible to implement the semiconductor storage apparatus managing system SY according to an embodiment of the invention by only the semiconductor storage apparatus 10. Therefore, it is not necessary to employ a special structure for the host apparatus 30 side (the host side managing program 32 (the managing tool)).

Moreover, it is also possible to provide, as a program, each component (each function) of the semiconductor storage apparatus managing system SY as described in an embodiment. Furthermore, the program can also be stored in various recording media (a CD-ROM and a flash memory) and can be thus provided. More specifically, each component (each function) of the semiconductor storage apparatus managing system SY that is programmed and a recoding medium recording the same are also included in the scope of rights of the invention.

Moreover, the apparatus structures and processing steps of the semiconductor storage apparatus 10 and the host apparatus 30 can be properly changed without departing from the scope of the invention.

The invention claimed is:

1. A semiconductor storage apparatus managing system for managing an apparatus lifetime of a semiconductor storage apparatus having a semiconductor memory area for storing data and a defective block substituting area for substituting a defective block in the semiconductor memory area, comprising:
   a consumed block number detecting section that detects a number of consumed blocks in the defective block substituting area; and
   a lifetime notifying section that predicts the apparatus lifetime of the semiconductor storage apparatus based on a result of the consumed block number detecting section and gives a notice of a result of the prediction;
   wherein the lifetime notifying section predicts the apparatus lifetime based on a worst value of a number of generation of acquired defective blocks in a unit time of the defective block substituting area.

2. The semiconductor storage apparatus managing system according to claim 1, further comprising a step notifying section that stepwise gives a notice of a consumption rate or a survival rate of the defective block substituting area which is obtained from the result of the detection of the consumed block number detecting section.

3. The semiconductor storage apparatus managing system according to claim 2, further comprising a smoothing section that smoothes the number of rewriting operations to each block in the semiconductor memory area.

4. The semiconductor storage apparatus managing system according to claim 3, wherein the semiconductor memory area and the defective block substituting area are constituted by a nonvolatile memory.

5. The semiconductor storage apparatus managing system according to claim 3, wherein at least one of the lifetime notifying section and the step notifying section gives a notice by using any of means including a screen display, a voice output, an electronic mail transmission, a command transmission and a telephone.

6. The semiconductor storage apparatus managing system according to claims 3, wherein the lifetime notifying section predicts the apparatus lifetime based the worst value in combination with a mean value or a current value of the number of generation of acquired defective blocks in a unit time of the defective block substituting area.

7. The semiconductor storage apparatus managing system according to claim 3, wherein the semiconductor storage apparatus managing system comprises:
   the semiconductor storage apparatus; and
   a host apparatus for giving access to the semiconductor storage apparatus, the semiconductor storage apparatus has a storage apparatus side controller for implementing the consumed block number detecting section and the smoothing section, and the host apparatus has a host side controller for implementing the lifetime notifying section and the step notifying section.

8. The semiconductor storage apparatus managing system according to claim 7, wherein the host side controller polls the storage apparatus side controller to acquire a result of detection of the consumed block number detecting section.

9. A semiconductor storage apparatus comprising:

a semiconductor memory area for storing data and a defective block substituting area for substituting a defective block in the semiconductor memory area; wherein the apparatus lifetime of the semiconductor storage apparatus is managed by the semiconductor storage apparatus managing system according to claim 1.

10. A method of managing a semiconductor storage apparatus having a semiconductor memory area for storing data and a defective block substituting area for substituting a defective block in the semiconductor memory area, the method comprising:

predicting an apparatus lifetime of the semiconductor storage apparatus based on a worst value of a number of generation of acquired defective blocks in a unit time of the defective block substituting area; and giving a notice of a result of the predicting.

11. A program product comprising a recording medium having recorded a program operable to cause a computer to execute the method according the claim 10.

* * * * *